United States Patent [19]

Sadr et al.

[11] Patent Number: 4,947,408
[45] Date of Patent: Aug. 7, 1990

[54] DIGITAL CARRIER DEMODULATOR EMPLOYING COMPONENTS WORKING BEYOND NORMAL LIMITS

[75] Inventors: Ramin Sadr, Westlake Village; William J. Hurd, La Canada, both of Calif.

[73] Assignee: The United States of America as represented by the Administrator of the National Aeronautics and Space Administration, Washington, D.C.

[21] Appl. No.: 350,813

[22] Filed: May 12, 1989

[51] Int. Cl.$^5$ .................................. H03D 1/06
[52] U.S. Cl. .......................... 375/94; 375/80; 329/310
[58] Field of Search ............. 375/39, 94, 77, 85, 375/86, 82, 80; 455/60; 329/310

[56] References Cited

U.S. PATENT DOCUMENTS

| | | | |
|---|---|---|---|
| 3,971,996 | 7/1976 | Motley et al. | 375/39 X |
| 4,079,329 | 3/1978 | England et al. | 375/82 X |
| 4,359,692 | 11/1982 | Ryan | 329/50 |
| 4,468,794 | 8/1984 | Waters et al. | 375/103 |
| 4,506,228 | 3/1985 | Kammeyer | 375/82 X |
| 4,594,555 | 6/1986 | Hilton | 329/135 |
| 4,594,725 | 6/1986 | Desperben et al. | 375/15 |
| 4,612,509 | 9/1986 | Betts et al. | 329/50 |
| 4,736,392 | 4/1988 | Kammeyer et al. | 375/80 |
| 4,737,728 | 4/1988 | Nakamura et al. | 375/82 X |
| 4,750,214 | 6/1988 | Hart et al. | 375/80 X |
| 4,839,652 | 6/1989 | O'Donnel et al. | 358/138 X |

Primary Examiner—Benedict V. Safourek
Assistant Examiner—Tesfaldet Bocure
Attorney, Agent, or Firm—Thomas H. Jones; John R. Manning; Charles E. B. Glenn

[57] ABSTRACT

In a digital device having an input thereto comprising a digital sample stream at a frequency F, a method for employing a component therein designed to work at a frequency less than F. The method in general comprises the steps of, dividing the digital sample stream into odd and even digital sample streams each at a frequency of F/2; passing one of the digital sample streams through the component designed to work at a frequency less than F wherein said component responds only to the odd or even digital samples in the one of the digital sample streams; delaying the other of the digital sample streams for the time it takes the one of the digital sample streams to pass through the component; and, adding the one of the digital sample streams after passing through the component with the delayed other of the digital sample streams. In the specific example, the component is a finite-impulse-response filter of order $[(N+1)/2]$ and the step of delaying comprises passing the other of the digital sample streams through a shift register for a time (in sampling periods) of $[(N+1)/2]+r$, where r is a pipeline delay through the finite-impulse-response filter.

10 Claims, 1 Drawing Sheet

DIGITAL CARRIER DEMODULATOR EMPLOYING COMPONENTS WORKING BEYOND NORMAL LIMITS

ORIGIN ON THE INVENTION

This invention described herein was made in the performance of work under a NASA contract, and is subject to the provisions of Public Law 96-517 (35 USC 202) in which the Contractor has elected not to retain title.

TECHNICAL FIELD

The invention relates to a digital carrier demodulator comprising, analog to digital conversion means for receiving an intermediate frequency analog signal and for outputting a digital representation thereof; sampling switch means for sampling the digital representation of the intermediate frequency analog signal from the analog to digital conversion means and for outputting a pair of digital sample streams; first multiplier means for multiplying one of the pair of digital sample streams with an in-phase carrier signal; second multiplier means for multiplying the other of the pair of digital sample streams with a quadrature carrier signal; first half-band digital low-pass filter means for filtering an output from the first multiplier means; second half-band digital low-pass filter means for filtering an output from the second multiplier means; first decimator means for decimating the number of samples from an output from the first half-band digital low-pass filter means; and, second decimator means for decimating the number of samples from an output from the second half-band digital low-pass filter means, the first and second decimator means each having an output which outputs are the output of the digital carrier demodulator which are input to a baseband signal processor.

In particular, the first and second half-band digital low-pass filter means each comprises, demultiplexer means for receiving a digital sample stream at an input thereof and for outputting a first output stream comprising odd samples from the digital sample stream and a second output stream comprising even samples from the digital sample stream; delay means for receiving and delaying the first output stream; finite-impulse-response filter means of order $[(N+1)/2]$ for receiving and filtering the second output stream; and, summing means for adding an output of the delay means and an output from a center tap of the filter means to produce a filtered output of the half-band digital low-pass filter means.

In its broadest concept, in a digital device having an input thereto comprising a digital sample stream at a frequency F, the invention relates to the method of employing a component therein designed to work at a frequency less than F comprising the steps of, dividing the digital sample stream into odd and even digital sample streams each at a frequency of F/2; passing one of the digital sample streams through the component designed to work at a frequency less than F wherein said component responds only to the odd or even digital samples in said one of the digital sample steams; delaying the other of the digital sample streams for the time it takes the one of the digital sample streams to pass through the component; and, adding the one of the digital sample streams after passing through the component with the delayed other of the digital sample streams.

BACKGROUND ART

In the field of digital carrier demodulation such as employed with the deep space advanced receiver the usual practice in the prior art is to find commercial components intended for use at the frequencies involved and to incorporate them into the circuit design. While this accomplishes the design and performance objectives, where the performance criteria is pushing the state of the art such components are typically high cost items causing the resultant equipment to be equally high in cost. Where the equipment is to be redundant (i.e. existing at multiple locations around the world), the total cost for the equipment including the high-priced, high-performance components can be staggering. Where the performance criteria calls for components which are not yet commercially available, the design of the circuits and the production of the equipment can be brought to a literal stand-still.

STATEMENT OF THE INVENTION

Accordingly, it is an object of this invention to provide a method of employing standard components in a way which allows them to achieve performance far in excess of that for which they were originally designed without any adverse effect.

Other objects and benefits of this invention will become apparent from the detailed description which follows hereinafter when taken in conjunction with the drawing figures which accompany it.

DETAILED DESCRIPTION OF THE INVENTION

The description which follows hereinafter is directed to a digital demodulator which has been designed at NASA's Jet Propulsion Laboratory in Pasadena, California, and in particular, to the design of the half-band digital low-pass filters employed therein. As those skilled in the art will readily recognize and appreciate, the methods employed by the inventors herein to achieve their results in this particular application can be adapted to many other applications to achieve similar benefits.

Figure 1:
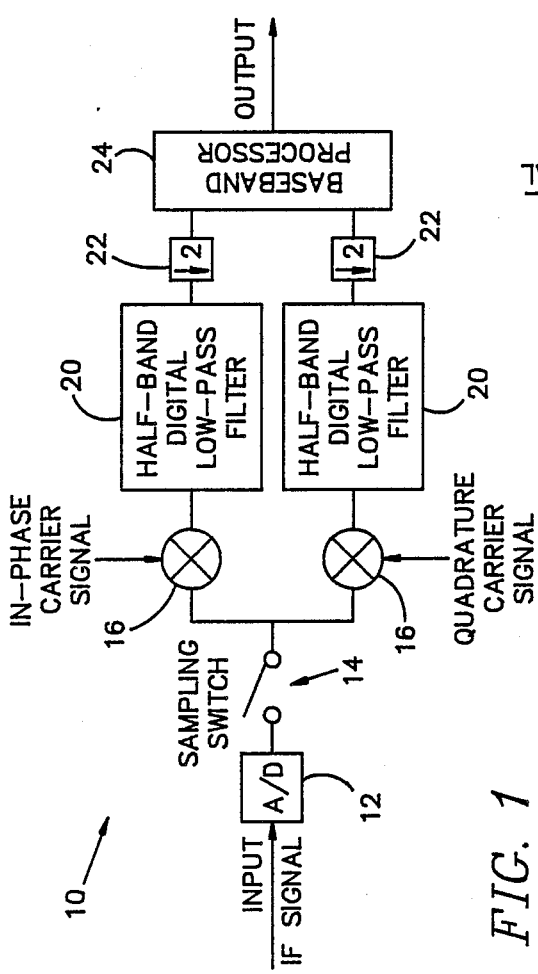
FIG. 1 is a simplified drawing showing the digital demodulator of the present invention.

The above-referenced digital demodulator (generally designated as 10 in FIG. 1) has been designed for use in the reception of phase- and amplitudemodulated digital signals of bandwidths up to 15 MHz on microwave carriers. The system performs coherent demodulation in phase and in quadrature with the carrier locked in-phase to an intermediate frequency (IF) of 10 MHz. In statistical simulations and in tests of a "breadboard" version, the demodulator 10 exhibited the expected high performance at low signal-to-noise ratios. The design is suitable for fabrication in very-large-scale integrated circuitry. The intermediate frequency is digitized by the analog-to-digital (A/D) converter 12 to 8 bits at a sampling rate (as set by the sampling switch 14) of 39.6 MHz (chosen to minimize self-induced radio frequency interference that would occur at 40 MHz with the carrier frequency of 10 MHz). At 16 and 18 the demodulator 10 multiplies the samples by cosine and sine waveforms at the 10 MHz intermediate frequency, thereby generating the in-phase and quadrature baseband signals, plus the sum-frequency components, which are then input to the baseband signal processor 24. The baseband signal processor 24, of course, measures all statistics needed by the software algorithms and outputs detected telemetry symbols to the decoder(s) (not shown) in a manner well known to those skilled in the art.

The principle innovative feature of the demodulator is the design of the half-band digital low-pass filters 20 that remove the sum-frequency components. It is this design that is the subject of the present invention. In concept, this kind of filter is a special case of the class of low-pass finite-impulse-response filters of order N. The half-band concept was chosen partly because almost half of the N filter coefficients are zero and consequently the number of multiplications and additions required is only half that of an arbitary linear-phase digital filter. This reduces the required complexity of the circuitry, particularly when decimation by 2 is used as at 22 following the filters 20 and prior to the baseband signal processor 24. Other considerations that favored this novel selection include:

(a) The width of the stopband equals the width of the passband. This is ideal for the elimination of sum frequencies that occur in complex heterodyning, because the sum-frequency components have the same bandwidths as that of the difference-frequency components to be passed.

(b) The peak deviations of the ripples in the passband and the stopband are equal. As a result, the signal-to-noise ratio due to the passband ripple is about the same as that due to the sum-frequency noise aliased into the passband after decimation by 2.

(c) When a decimation factor of 2 is employed, the processing rate is also reduced by a factor of 2.

Figure 2:
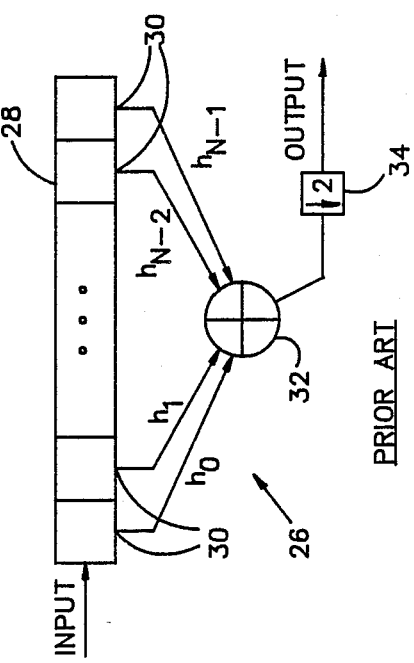
FIG. 2 is a simplified drawing showing the prior art approach to filtering.

FIG. 2 illustrates a simplified architecture for the Nth (N odd) order finite-impulse-response filter 26 which would normally be employed in a prior art solution to the problem. The filter output is denoted as $y_n$, the input as $x_n$, and the filter coefficient as $h_j$. The filter 26 comprises an N-tap filter 28. The outputs from the taps 30 of the filter 28 are multiplied together at 32 and then decimated at 34 to provide the output. The output $y_n$ of the filter 26 at the nth sampling interval is given by:

$$y_n = \sum_{j=-[(N-1)/2]}^{j=[(N-1)/2]} h_j x_{n-j}$$

The output of a half-band filter can similarly be expressed as:

$$y_n = \sum_{jodd=-[(N-1)/2]}^{j=[(N-1)/2]} h_j x_{n-j} + x_n$$

where j is non-zero and odd, and $x_n$ denotes the input at the nth sampling interval.

Figure 3:
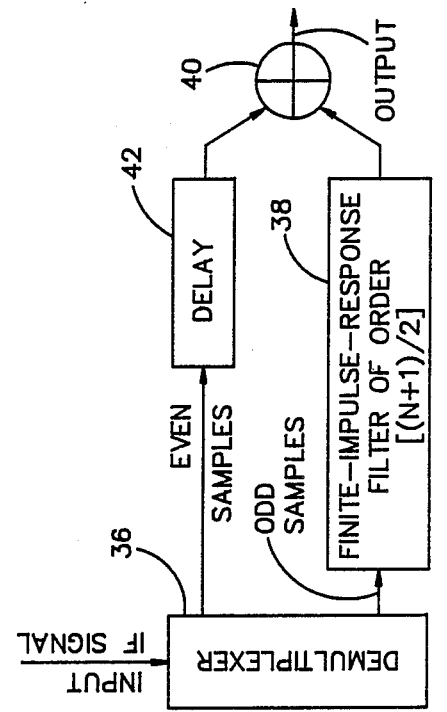
FIG. 3 is a functional block diagram showing the approach to filtering of the present invention which is incorporated into the digital demodulator of FIG. 1 in lieu of the prior art filtering approach of FIG. 2.

In this latter expression for $y_n$ with even-n (decimation factor of 2), the only term in the output that involves the even samples is the last term, which corresponds to the center tap of the filter. Thus, it was realized by the inventors herein that it would be possible to reduce the computation of $y_n$ for even-n into a lower-order (half) filtering and an addition operation. This approach to the problem according to the present invention is depicted in FIG. 3. First, the input is demultiplexed at 36 into odd and even samples. The odd samples are filtered using an $[(N\times1)/2]$-tap finite-impulse-response filter 38. The output of the filter 38 (taken at only the center tap thereof) is summed at 40 with the even sample, delayed at 42, to produce the desired output. The simplicity of this architecture is evident from a comparison with the structure of the general fast-impulse-response filter 26 of FIG. 2. The length of the delay 42 (in sampling periods) in the simplified modle is $[(N+1)/2]+r$, where r is the pipeline delay through the finite-impulse-response filter 38. In a tested embodiment, the delay 26 was accomplished using a shift register. The filter 38 was implemented using an 8th order finite-impulse-response (FIR) filter chip, ZR-33891 (Zoran Corp.), operating up to 25 MHz. This chip supports 9-bit data and 9-bit coefficients, and it outputs 26 bits.

As those skilled in the art will readily appreciate, the structure and approach of FIG. 3 has the important additional advantage that the filter 38 operates at half the input frequency. Thus, the components can be slower than those of a general finite-impulse-response filter such as that of FIG. 2. This, of course, is the very feature mentioned earlier which helps reduce the cost; that is, the components employed can be cheaper components intended for much lower frequency use since they are operating in an environment far in excess of that for which they were designed. Note, however, that the approach of the present invention, while using such components in an environment beyond their design range, does nothing to impose any damaging effects on the components. Furthermore, it is also possible to take advantage of the symmetry of the coefficients of the fast-impulse-response filter to reduce the number of multiplications by another factor of 2. Basically, what the present invention has accomplished in the above-described application is to allow twice the speed and twice the data to be obtained from the components as compared to their design specifications. In the particular example, data is input at approximately 40 MHz and (under normal circumstances and without this invention) would need the accuracy provided by a 15-tap filter to produce a 20 MHz output. Rather than employing the off-shelf part (i.e. the filter 26 of FIG. 2) selling at about $300 each (with two being required for each receiver), this invention allows the same performance to be obtained employing a substantially less expensive filter intended for 20 MHz applications and having eight taps plus a cheap delay line and a single adder. As can be appreciated, as technology advances faster than the parts available, using the approach of this invention allows one to use parts that otherwise would not be able to meet the performance requirements of the application.

Wherefore, having thus described the present invention, what is claimed is:

1. A digital carrier demodulator comprising:
   (a) analog to digital conversion means for receiving an intermediate frequency analog signal and for outputting a digital representation thereof;
   (b) sampling switch means for sampling said digital representation of said imtermediate frequency analog signal from said analog to digital conversion means and for outputting a pair of digital sample streams;

(c) first multiplier means for multiplying one of said pair of digital sample streams with an in-phase carrier signal;

(d) second multiplier means for multiplying the other of said pair of digital sample streams with a quadrature carrier signal;

(e) first half-band digital low-pass filter means for filtering an output from said first multiplier means;

(f) second half-band digital low-pass filter means for filtering an output from said second multiplier means;

(g) first decimator means for decimating the number of samples from an output from said first half-band digital low-pass filter means; and, (h) second decimator means for decimating the number of samples from an output from said second half-band digital low-pass filter means, said first and second decimator means each having an output, said output of said first decimator means and said output of said second decimator means in combination comprising an output of the digital carrier demodulator; and wherein additionally, (i) said first and second half-band digital low-pass filter means each comprises, (i1) demultiplexer means for receiving a digital sample stream at an input thereof and for outputting a first output stream comprising odd samples from said digital sample stream and a second output stream comprising even samples from said digital sample stream, (i2) finite-impulse-response filter means having an input thereto and N taps to output data therefrom and being of order $[(N+1)/2]$ for receiving and filtering said second output stream, (i3) delay means having an input and an output for receiving and delaying said first output stream for a time (in sampling periods) of $[(N+1)/2]+r$, where a pipeline delay through said finite-impulse-response filter means, and (i4) summing means for adding an output from said output of said delay means and an output from a center one of said taps of said filter means to produce a filtered output of said half-band digital low-pass filter means.

2. The digital carrier demodulator of claim 1 wherein:
said finite-impulse-response filter means of order $[(N+1)/2]$ is of an order less than the sampling frequency set by said sampling switch means for said pair of digital sample streams.

3. The digital carrier demodulator of claim 2 wherein:
said finite-impulse-response filter means is of an order which is approximately half the sampling frequency set by said sampling switch means for said pair of digital sample streams.

4. In a digital carrier demodulator having,
analog to digital conversion means for receiving an intermediate frequency analog signal and for outputting a digital representation thereof,
sampling switch means for sampling the digital representation of the intermediate frequency analog signal from the analog to digital conversion means and for outputting a pair of digital sample streams,
first multiplier means for multiplying one of the pair of digital sample streams with an in-phase carrier signal, and second multiplier means for multiplying the other of the pair of digital sample streams with a quadrature carrier signal the improvement comprising:

(a) first half-band digital low-pass filter means for filtering an output from the first multiplier means;

(b) second half-band digital low-pass filter means for filtering an output from the second multiplier means;

(c) first decimator means for decimating the number of samples from an output from said first half-band digital low-pass filter means; and, (d) second decimator means for decimating the number of samples from an output from said second half-band digital low-pass filter means, said first and second decimator means each having an output, said output of said first decimator means and said output of said second decimator means in combination comprising an output of the digital carrier demodulator; and wherein additionally, (i) said first and second half-band digital low-pass filter means each comprises, (i1) demultiplexer means for receiving a digital sample stream at an input thereof and for outputting a first output stream comprising odd samples from said digital sample stream and a second output stream comprising even samples from said digital sample stream, (i2) finite-impulse-response filter means having an input thereto and N taps to output data therefrom and being of order $[(N+1)/2]$ for receiving and filtering said second output stream, (i3) delay means having an input and an output for receiving and delaying said first output stream for a time (in sampling periods) of $[(N+1)/2]+r$, where r is a pipeline delay through said finite-impulse-response filter means, and (i4) summing means for adding an output from said output of said delay means and an output from a center one of said taps of said filter means to produce a filtered output of said half-band digital low-pass filter means.

5. The improvement to a digital carrier demodulator of claim 4 wherein:
said finite-impulse-response filter means of order $[(N+1)/2]$ is of an order less than the sampling frequency set by the sampling switch means for the pair of digital sample streams.

6. The improvement to a digital carrier demodulator of claim 5 wherein:
said finite-impulse-response filter means is of an order which is approximately half the sampling frequency set by the sampling switch means for the pair of digital sample streams.

7. In a digital device having an input thereto comprising a digital sample stream at a frequency F, the method of employing a component therein designed to work at a frequency less than F comprising the steps of:

(a) dividing the digital sample stream into odd and even digital sample streams each at a frequency of F/2;

(b) passing one of the digital sample streams through the component designed to work at a frequency less than F wherein said component responds only to the odd or even digital samples in said one of the digital sample streams;

(c) delaying the other of the digital sample streams for the time it takes the one of the digital sample streams to pass through the component; and, (d) adding the one of the digital sample streams after passing through the component with the delayed other of the digital sample streams.

8. The method of claim 7 wherein the component is a finite-impulse-response filter having an input thereto and N taps to output data therefrom and being of order $[(N+1)/2]$ and said step of delaying the other of the digital sample streams for the time it takes the one of the digital sample streams to pass through the component comrises:

passing the other of the digital sample streams through a shift register for a time (in sampling periods) of $[(N+1)/2]+r$, where r is a pipeline delay through the finite-impulse-response filter.

9. In a digital carrier demodulator having an input thereto comprising a digital sample stream at a frequency F, the method of employing filters therein designed to work at a frequency less than F comprising the steps of:

(a) demultiplexing the digital sample stream into odd and even digital sample streams each at a frequency of F/2;

(b) passing the even digital sample stream through a finite-impulse-response filter having an input thereto and N taps to output data therefrom and being of order $[(N+1)/2]$ and capable of working only at a frequency less than F;

(c) passing the other of the digital sample streams through a shift register for a time of (in sampling periods) $[(N+1)/2]+r$, where r is a pipeline delay through the finite-impulse-response filter; and, (d) adding outputs of the finite-impulse-response filter and the shift register.

10. The method of claim 9 wherein said step of adding outputs of the finite-impulse-response filter and the shift register comprises:

adding an output from a center tap of the finite-impulse-response filter to an output from the shift register.

* * * * *